United States Patent [19]

Toth

[11] Patent Number: 4,915,492

[45] Date of Patent: Apr. 10, 1990

[54] MIRROR TRANSDUCER ASSEMBLY WITH SELECTED THERMAL COMPENSATION

[76] Inventor: Theodor A. Toth, 1533 Trapp Ct., Fridley, Minn. 55432

[21] Appl. No.: 306,973

[22] Filed: Feb. 6, 1989

[51] Int. Cl.$^4$ .......................... G02B 5/08; H01S 3/083; H01L 41/08

[52] U.S. Cl. .................................... 350/632; 356/350; 372/107; 310/332

[58] Field of Search .................. 350/487, 609, 632; 310/332; 356/350; 372/107

[56] References Cited

U.S. PATENT DOCUMENTS

| | | | |
|---|---|---|---|
| 3,581,227 | 5/1971 | Podgorski | 372/107 |
| 4,383,763 | 5/1983 | Hutchings et al. | 356/350 |
| 4,488,080 | 12/1984 | Baumann | 310/328 |
| 4,691,323 | 9/1987 | Ljung et al. | 356/350 |
| 4,824,253 | 5/1989 | Butler et al. | 356/350 |

Primary Examiner—Bruce Y. Arnold
Assistant Examiner—J. Patrick Ryan
Attorney, Agent, or Firm—Robert A. Pajak

[57] ABSTRACT

In the present invention, a mirror transducer assembly is comprised of a mirror assembly and a driver assembly. Both the mirror assembly and the driver assembly include a diaphragm portion surrounding an integral central post member. The central post members are rigidly coupled together to provide tandem translation movement along a central axis passing through the central post members. A pair of non symmetrical piezoelectric disks are positioned on opposite sides of the diaphragm portion of the driver assembly. The size of the piezoelectric disks are selected to achieve a selected temperature sensitivity of movement of said tandem central members along an axis passing therethrough.

4 Claims, 3 Drawing Sheets

MIRROR TRANSDUCER ASSEMBLY WITH SELECTED THERMAL COMPENSATION

BACKGROUND OF THE INVENTION

The present invention relates to piezoelectrical control elements. More, particularly, the present invention relates to a mirror transducer assembly for ring laser gyros.

Ring laser gyros require some form of path length control. Path length control in ring laser gyros has generally been provided by variety of piezoelectric element driven transducer assemblies. Such assemblies have included one or more piezoelectric elements. Examples of piezoelectric control elements used in ring laser gyro applications are illustrated in U.S. Pat. No. 3,581,227 issued to Podgorski, U.S. Pat. No. 4,383,763 issued to Hutchings et al., U.S. Pat. No. 4,697,323 issued to Ljung, et al., and U.S. Pat. No. 4,488,080 issued to Baumann.

Podgorski shows and claims the use of a transducer block, the block being composed of a dimensionally stable material as that used for the laser block which contains a lasing gas. The transducer block is circularly grooved on its internal side to leave a depressed thin integral gas impervious annular web or diaphragm extending between a central post and an outer rim, both being integral with the diaphragm. The central post is generally cylindrical and is inwardly-standing from and integral with the annular diaphragm. Radially outward from the groove is a rigid annular member or outer rim which is integral with the annular diaphragm but which extends axially external to the region enclosed by the annular diaphragm. Within an opening formed by the rigid annular member but external to the annular diaphragm is a stack of piezoelectric ceramic wafers which bear against the external side of the annular diaphragm and of the inwardly standing post. The opening containing the ceramic wafer stack is closed with a rigid disk-like member which is rigidly attached to the annular member to support the stack of ceramic wafers.

Further, on the external side of the central post is a light reflecting means, generally provided by a deposition of selected materials to form a mirror. The transducer assembly is positioned on the laser block to reflect the laser beams within the cavity provided by the laser block.

All of the, other aforementioned patents utilize one or more of the principles taught by Podgorski.

Ljung et al. and Hutching et al. teach the use of a double diaphragm mirror assembly which includes a piezoelectric driver assembly. The mirror assembly includes a central post which is coupled to a driver assembly. The driver assembly is a cup-shaped metallic driver fixture having a annular diaphragm extending between an integral central member and outer rim member. The central member is rigidly coupled to or attached to the central post of the mirror assembly. A pair of symmetrical donut-shaped piezoelectric disks are positioned on opposite sides of the annular diaphragm to provide the transducer action.

Ring laser gyros require that laser path length be maintained substantially constant. This is so since the laser beam intensity is dependent upon the path length. Variations in the beam intensity can adversely affect the performance parameters of the gyro, i.e., gyro errors. In order to maintain the ring laser path length constant, a mirror transducer like the ones already described are commonly employed.

The operating range of mirror transducers of the kind described is generally quite limited. Therefore, in ring laser gyro applications, commonly, a mode reset circuit is employed to always maintain the transducer within its operating limits. Herein mode is the equivalent of one wavelength of the laser beam. For a helium-neon laser, one mode is equal to 6328 Angstroms which is equal to 24.91 micro-inches. Temperature change of the gyro laser block as well as the transducer assembly, itself, are primary contributors to path length changes of the laser beam. Unfortunately, each "mode reset" of the transducer contributes to the overall gyro performance error budget.

BRIEF DESCRIPTION OF THE INVENTION

In the present invention, a mirror transducer assembly is comprised of a mirror assembly and a driver assembly. Both the mirror assembly and the driver assembly include a diaphragm portion surrounding an integral central post member. The central post members are rigidly coupled together to provide tandem translation movement along a central axis passing through the central post members. A pair of non symmetrical piezoelectric disks are positioned on opposite sides of the diaphragm portion of the driver assembly. The size of the piezoelectric disks are selected to achieve a selected temperature sensitivity of movement of said tandem central members along an axis passing therethrough.

DETAILED DESCRIPTION OF THE DRAWINGS

DETAILED DESCRIPTION OF THE INVENTION

Figure 1:
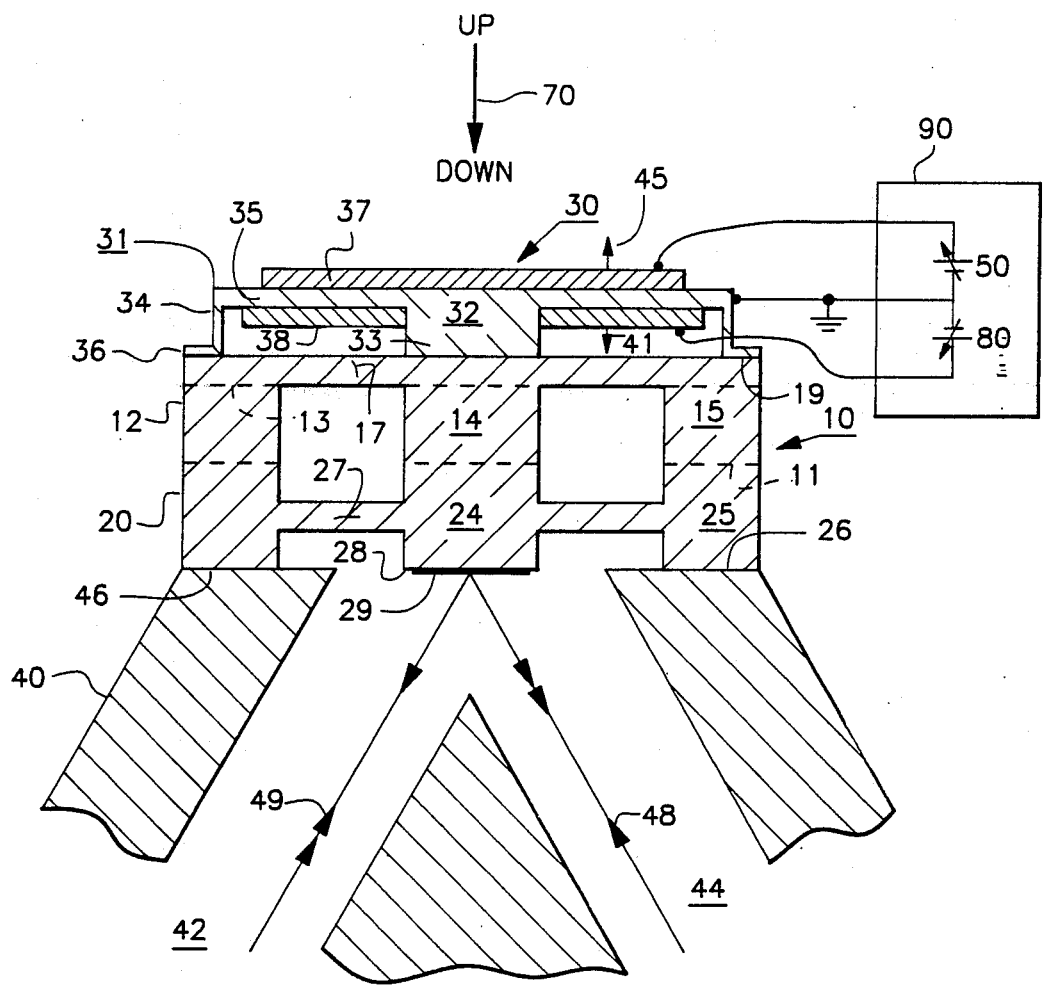
FIG. 1 shows a cross-section diagram of a mirror transducer assembly, in accordance with the present invention, mounted to a ring laser block.

FIG. 1 illustrates a mirror transducer assembly utilizing the principles of U.S. Pat. No. 3,581,227 and the particular double diaphragm structure illustrated in aforementioned U.S. Pat. Nos. 4,383,763, 4,691,323, and 4,488,080.

The mirror transducer is comprised of a mirror assembly 10 and a driver assembly 30. A double diaphragm mirror assembly is illustrated in FIG. 1, and is generally cylindrically shaped and includes a top half 12 and a bottom half 20 being E-shaped in cross section. Top half 12 includes a central post member 14, an outer rim member 15 and a thin annular diaphragm member 17 extending radially between central post member 14 and outer rim member 15. Similarly, bottom half 20 includes a central post member 24 and outer rim member 25 and a thin annular diaphragm member 27 extending between central member 24 and outer rim member 25. Outer rim member 25 includes a mounting surface 26. Further, central post member 24 includes an external surface 28 having either a mirror or reflective means 29, generally being a multilayer dielectric mirror.

Mirror assembly 10 may be constructed in a variety of ways to achieve the intended purpose. For example, mirror assembly 10 may be comprised of two individual E-shape piece parts for top half 12 and bottom half 20 and joined at their interface 11 as illustrated in FIG. 1. Alternatively, a cylindrical block may be provided with top and bottom annular grooves to form diaphragm 27; and the second diaphragm 17 is provided by a disk and joined at surface 13 to create the double diaphragm. Another embodiment of mirror assembly 10 may be a single block which is bored to provide the double diaphragm members 17 and 27 as illustrated.

Mirror assembly 10 is shown rigidly fixed to a corner of a ring laser block 40 having a pair of interconnecting tunnels 42 and 44. Laser block 40 generally includes a mounting surface 46 which is fixed to surface 26 of outer rim member 25 for providing a generally gas tight seal therebetween.

Mirror assembly 10 is positioned on laser block 40 such that laser beams 48 and 49 can reflect off of mirror 29 in a well known manner.

Driver assembly 30 is comprised of a generally cup-shaped driver fixture 31 including a central post member 32, an outer rim member 34, and an annular diaphragm member 35 extending between and integral with central post member 32 and outer rim member 34. Extending from outer rim member 34 is a mounting flange 36 which is secured to mirror assembly outer rim member 15 at surface 19 thereof. Further, central post member 32 is fixed to central post member 14 at surface 19 thereof.

Button-shaped piezoelectric disk 37 and donut-shaped piezoelectric disk 38 are fixed to opposite sides of diaphragm member 35. Disk 38 surrounds protruding extension member 33 of central post member 32. The polarization vectors of piezoelectric disks 37 and 38 are arranged to be in an opposite sense as particularly illustrated by arrows 41 and 45. In the preferred embodiment of the invention, the polarization vectors of piezoelectric disks 37 and 38 are pointing in an opposite direction. In FIG. 1, the polarization vectors are pointing away from driver fixture 31.

In the following exposition, the following conventions should be noted. A positive potential connected at the polarization vector arrow head side of the piezoelectric disk relative to the opposite side thereof will cause the disk to expand in a direction in parallel with the arrow and contract along a direction transverse to the arrow.

In one embodiment of the invention, driver fixture 31 is electrically conductive and electrically connected in common to one side of disks 37 and 38 through an electrically conductive adhesive (not shown). As illustrated in the drawing, driver fixture 31 is electrically connected to the electrical ground, and to the lower surface of piezoelectric disk 37 and to the upper surface of piezoelectric disk 38.

As further illustrated in the drawing, the electrical connections of the disks 37 and 38 are electrically connected to control circuit 90. Control circuit 90 may be represented by two voltage sources 50 and 80. One embodiment for control circuit 9 is diagrammatically illustrated in FIG. 2.

Referring to FIG. 1, the upper surface of disk 37 is electrically connected through lead 51 to the positive side of source 50, and the lower surface of disk 38 is electrically connected through lead 81 to the positive side of source 80. In the preferred embodiment, sources 50 and 80 represent variable voltage sources which may be independently controlled or alternatively controlled in an opposite sense. In the latter case, as the output voltage of source 50 increases, the output voltage of source 80 decreases. Voltage outputchanges in this manner will cause flexure of driver fixture 31 and subsequent movement of mirror 29 relative to surface 46 of block 40 as will be further described.

In the preferred embodiment of the invention, the piezoelectric disks are always operated with a positive voltage between zero and a maximum supply voltage $V_s$. Operation of the piezoelectric disks in this manner avoids the problem of "depolarization" of the piezolelectric disks.

With the polarization vectors 41 and 45 as shown, and a positive voltage of the same magnitude applied to each disk 37 and 38 as illustrated, mirror 29 will tend to be positioned in a more upward position than illustrated in the drawing. This is s since piezoelectric disk 37 has a smaller outside radius than that of disk 38 resulting in disk 37 contracting less in the radial direction than disk 38. Accordingly, driver fixture 31 will bend upward causing the position of mirror 29 to be more upward than as illustrated in FIG. 1. If disks 37 and 38 are of the same size, both piezoelectric disks will contract by the same amount resulting in no flexure of driver fixture 31.

Increasing the output voltage of source 50 while decreasing the output voltage of source 80 from an initial condition will cause piezoelectric disk 37 to contract in the radial direction, and cause piezoelectric disk 38 to expand in the radial direction, respectively. The net effect of these changes in the piezoelectric disks is to cause flexure of driver fixture 31 in the downward direction, and thereby cause downward movement of the combination of central post members 32, 14 and 24 and mirror 29. Voltage changes of sources 50 and 80 in an opposite sense as already described will have an opposite effect, that is the driver fixture 31 will move in an upward direction. As illustrated by the control circuit of FIG. 2, piezoelectric disks 37 and 38 can be independently controlled by control inputs A and B.

In ring laser applications, particularly ring laser gyros, small translational movements (micro inches) of mirror 29 can cause variations in laser beam intensity of the counter-propagating laser beams traveling within a ring laser. This in turn can cause performance errors in ring laser gyros.

For example, consider the situation where the mirror assembly 10 has substantially a zero temperature coefficient by use of quartz like materials such as Zerodur and Cervit. Unfortunately driver fixture 31 is generally composed of a metal having a positive temperature coefficient, and piezoelectric elements 37 and 38 also have positive temperature coefficients. Assuming that this is the case, and that piezoelectric elements 37 and 38 are identical in size, then one can predict the result of an increase in temperature on the movement of mirror 29.

For example, if piezoelectric elements 37 and 38 are omitted, and drive fixture 31 has a positive temperature coefficient, diaphragm member 35 will tend to expand in a radial direction with a positive temperature change causing an upward motion of mirror 29. If however driver fixture 31 has a zero temperature coefficient and only piezoelectric disk 37 exists, a positive temperature change will cause piezoelectric disk 37 to expand in a radial direction also causing an upward movement of mirror 29. If only piezoelectric disk 38 exists, a positive change in temperature will cause piezoelectric disk 38 to expand and cause diaphragm member 35 to bend in a downward direction, thereby moving mirror 29 in a downward direction.

As was previously taught in the prior art by U.S. Pat. No. 4,383,763 and U.S. Pat. No. 4,691,323, the use of a pair of symmetrical piezoelectric elements on opposite sides of diaphragm member 35 will self compensate for temperature effects on the piezoelectric disks. Thus, with symmetrical disks of the same size, the only movement of mirror 29 will be that caused by the effect of temperature on driver fixture 31.

In the present invention, it is intended to achieve a mirror transducer assembly having a selected temperature sensitivity of the translational movement of mirror 29 along an axis passing through and perpendicular to mirror 29. In accordance with the present invention, the outer radius of the piezoelectric disks 37 and 38 are intentionally made to be different so as to provide thermal compensation in a manner as will be described.

In the preferred embodiment of the invention, driver fixture 31 is intended to be composed of Super Invar. Even with this excellent material, the bending of diaphragm member 35 caused by temperature changes is still sufficient to cause adverse changes in the laser beam path length in the ring laser, i.e., translational movement of mirror 29. Because the piezoelectric disks 37 and 38 have temperature coefficients much greater than Super Invar or Invar, (in the order of 1.2 micro inches/° F.), the present invention takes advantage of the larger temperature coefficient of the piezoelectric disks, compared with INVAR, by selecting one or the other piezoelectric disks 37 or 38 to be a different size to provide a selected temperature compensation for the affects of temperature on the driver fixture 31.

For example, excellent results were achieved when the outside diameter of piezoelectric disk 38 was 0.970 inches and the outside diameter of piezoelectric disk 37 was 0.700 inches. In this situation, a temperature increase causes a greater movement in the downward direction than in the upward direction since the size of the piezoelectric disk 38 was greater than the size of the piezoelectric disk 37. This in affect compensated for the small upward motion caused by the temperature effect on a Super Invar driver fixture 31.

It should be understood by those skilled in the art that it may be desirable to provide whatever motion upward or downward of mirror 29 to not only compensate for temperature effects caused by the driver fixture driver, but also the effects on the path length of the ring laser caused by temperature effects on the ring laser gyro block and other connected components. By careful analysis of the mechanical design of a ring laser gyro, different sizes of piezoelectric disks 37 and 38 can be selected to compensate for temperature path length changes caused by, for example, the driver fixture, the laser block, and the mechanical dither motor used with such gyros, as well as other components.

It should be understood by those skilled in the art, that the sizing of piezoelectric disks 37 and 38 depend upon the temperature characteristics of the materials of the piezoelectric disks and the material of the driver fixture. It should also be understood that the sizing differences between the piezoelectric disks is dependent upon specific details of the transducer assembly as a whole. Analysis is required for each transducer assembly for proper determination of dimensions of the piezoelectric disks.

Figure 2:
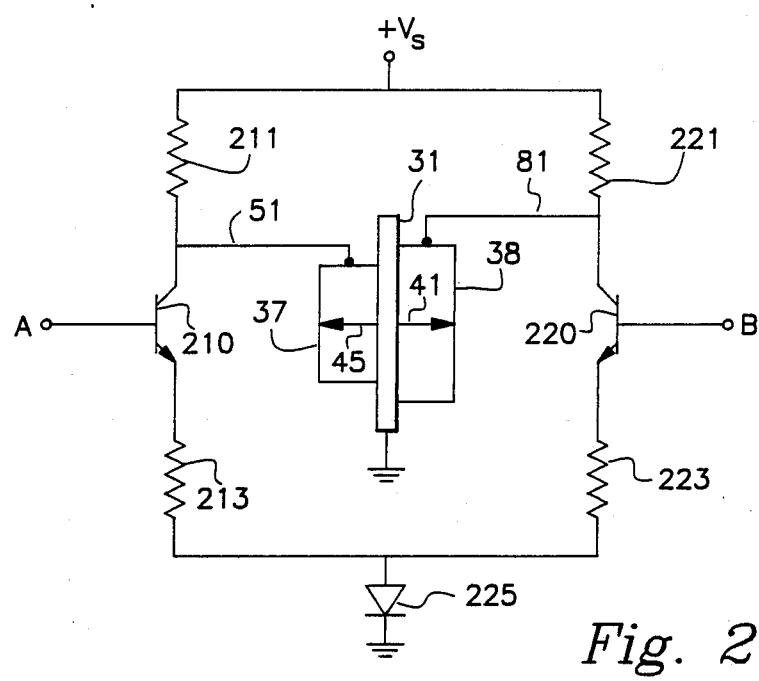
FIG. 2 illustrates one embodiment of a control circuit for a mirror transducer.
Figure 3:
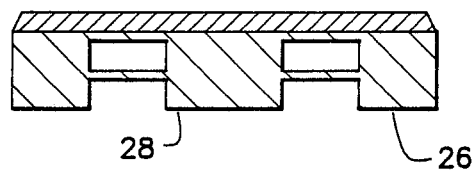
FIGS. 3–4 show cross-sections of different mirror assemblies which are within the scope of the present invention.
Figure 4:
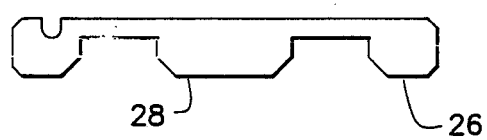

It should be understood by those skilled in the art that although the driver assembly has been shown in combination with a double diaphragm, either a unitary structure or a two piece part structure, the application of a driver assembly utilizing two piezoelectric disks of different size is applicable to mirror assemblies of different design. FIGS. 2-4 illustrate, among other, mirror assemblies which can also be used in combination with the driver assembly of the present invention.

It should be noted that all of the above cited patents and publications are herein incorporated by reference.

While only preferred embodiments of the invention have been shown and described, it is intended that this invention be interpreted as contemplating any variations which are within the true spirit and scope of the invention. Particularly, the transducer assembly is applicable to any optical device, but particularly to lasers and ring lasers.

Further, although in the preferred embodiment of the invention only the outer diameter of the piezoelectric elements where made to be different, this is not a requirement. Only by careful design and analysis can one determine the amount of expansion or contraction of the piezoelectric disks which in turn determines the net temperature sensitivity of the transducer mirror assembly.

The embodiments of an invention in which an exclusive property or right is claimed are defined as follows:

1. A mirror transducer assembly comprising:
   a mirror assembly having,
   a central member having first and second opposite ends,
   an outer rim member, and
   a flexible annular diaphragm area between and integral with said central member and said outer rim member, and
   said central member having a first central axis passing centrally through said first and second opposite ends of said central member, and
   said first end including means for reflecting electromagnetic waves;
   a driver assembly having,
   a central member having first and second opposite ends,
   an outer rim member, and
   a flexible annular diaphragm area between and integral with said central member and said outer rim member of said driver assembly, and
   a second central axis passing centrally through said first and second opposite ends of said central member of said driver assembly;
   means for rigidly coupling together said outer rim members of said mirror assembly and said driver assembly;
   means for coupling said central member of said driver assembly to said central member of said mirror assembly, and
   first and second piezoelectric disks rigidly fixed to opposite sides of at least a portion of said flexible annular diaphragm area of said driver assembly, and wherein said first and second disks are of different sizes and have a selected difference in geometrical configuration to provide a selected temperature sensitivity of the movement of said central member of said driver assembly along said second central axis.

2. The transducer of claim 1 further comprising means for rigidly fixing said outer rim member of said mirror assembly to a ring laser block.

3. The transducer of claim 1 wherein said first and second piezoelectric disks are circular in form having different outside diameters.

4. A mirror transducer assembly comprising:
a mirror assembly having
- a central member having first and second opposite ends,
- said central member having a first central axis passing centrally through said first and second opposite ends of said central member, and
- said first end including means for reflecting electromagnetic waves; and a driver assembly having,
- a central member having first and second opposite ends,
- an outer rim member,
- a flexible annular diaphragm area between and integral with said central member and said outer rim member of said driver assembly, and
- a second central axis passing centrally through said first and second opposite ends of said central member of said driver assembly;

means for rigidly coupling together said outer rim members of said mirror assembly and said driver assembly;

means for coupling said central member of said driver assembly to said central member of said mirror assembly; and first and second piezolelectric disks rigidly fixed and second piezolelectric disks rigidly portion of said flexible annular diaphragm area of said driver assembly, and wherein said first and second disks are of different sizes and have a selected difference in geometrical configuration to provide a selected temperature sensitivity of the movement of said central member of said driver assembly along said second central axis.

* * * * *

UNITED STATES PATENT AND TRADEMARK OFFICE
CERTIFICATE OF CORRECTION

PATENT NO. : 4,915,492

DATED : April 10, 1990

INVENTOR(S) : Theodore A. Toth

It is certified that error appears in the above-identified patent and that said Letters Patent is hereby corrected as shown below:

Column 8, line 10, delete "and second piezoelectric disks rigidly" and substitute with --to opposite sides of at least a--

Signed and Sealed this

Sixth Day of October, 1992

Attest:

DOUGLAS B. COMER

*Attesting Officer*          *Acting Commissioner of Patents and Trademarks*